(12) United States Patent
Zhong et al.

(10) Patent No.: US 9,957,603 B2
(45) Date of Patent: May 1, 2018

(54) METHOD FOR PREPARING HIGH-PERFORMANCE TANTALUM TARGET

(71) Applicant: NINGXIA ORIENT TANTALUM INDUSTRY CO., LTD., Shizuishan, Ningxia (CN)

(72) Inventors: Jingming Zhong, Ningxia (CN); Zhaobo Li, Ningxia (CN); Kai Wang, Ningxia (CN); Wenming Chen, Ningxia (CN)

(73) Assignee: NINGXIA ORIENT TANTALUM INDUSTRY CO., LTD., Shizuishan, Ningxia (CN)

(*) Notice: Subject to any disclaimer, the term of this patent is extended or adjusted under 35 U.S.C. 154(b) by 425 days.

(21) Appl. No.: 14/418,882

(22) PCT Filed: Aug. 16, 2013

(86) PCT No.: PCT/CN2013/081636
§ 371 (c)(1),
(2) Date: Jan. 30, 2015

(87) PCT Pub. No.: WO2014/026639
PCT Pub. Date: Feb. 20, 2014

(65) Prior Publication Data
US 2015/0211107 A1    Jul. 30, 2015

(30) Foreign Application Priority Data

Aug. 16, 2012 (CN) .......................... 2012 1 0292279

(51) Int. Cl.
| | |
|---|---|
| C22F 1/18 | (2006.01) |
| C23C 14/34 | (2006.01) |
| B21B 15/00 | (2006.01) |
| B21B 45/00 | (2006.01) |
| C22C 27/02 | (2006.01) |
| C23C 14/14 | (2006.01) |
| H01J 37/34 | (2006.01) |
| H01L 21/285 | (2006.01) |
| B21B 1/02 | (2006.01) |

(52) U.S. Cl.
CPC ...... *C23C 14/3414* (2013.01); *B21B 15/0007* (2013.01); *B21B 45/004* (2013.01); *C22C 27/02* (2013.01); *C22F 1/18* (2013.01); *C23C 14/14* (2013.01); *H01J 37/3426* (2013.01); *H01J 37/3491* (2013.01); *H01L 21/2855* (2013.01); *B21B 1/024* (2013.01); *B21B 1/026* (2013.01); *H01J 2237/3323* (2013.01)

(58) Field of Classification Search
None
See application file for complete search history.

(56) References Cited

U.S. PATENT DOCUMENTS

| | | | |
|---|---|---|---|
| 6,348,113 B1 * | 2/2002 | Michaluk | C22B 34/24 148/423 |
| 2005/0155677 A1 | 7/2005 | Wickersham | |
| 2005/0247386 A1 | 11/2005 | Matera et al. | |
| 2009/0301151 A1 * | 12/2009 | Shimoda | C10M 173/02 72/42 |
| 2012/0297855 A1 | 11/2012 | Matera et al. | |

FOREIGN PATENT DOCUMENTS

| | | |
|---|---|---|
| CN | 1981067 A | 6/2007 |
| CN | 101670521 A | 3/2010 |
| CN | 101704187 A | 5/2010 |
| CN | 102296272 A | 12/2011 |
| CN | 102989767 A | 3/2012 |
| CN | 102517531 A | 6/2012 |
| CN | 102517550 A | 6/2012 |
| CN | 102909299 A | 2/2013 |
| CN | 103028898 A | 4/2013 |
| JP | 2003-533589 | 11/2003 |
| JP | 2007113117 A | 5/2007 |

OTHER PUBLICATIONS

Translation of CN 101704187 A (published May 12, 2010) from Espacenet.*

(Continued)

*Primary Examiner* — George Wyszomierski
(74) *Attorney, Agent, or Firm* — Fenwick & West LLP (57) ABSTRACT

A method for preparing a high-performance tantalum target, a high-performance target prepared by the method, and a use of the high-performance target. The method for preparing the high-performance tantalum target comprises: firstly, preparing a tantalum ingot into a forging blank by a method of cold forging in conjunction with hot forging; then, rolling the forging blank by a hot rolling method; and finally, performing leveling, and performing discharging, milling and surface treatment according to a size of a finished product, so as to obtain the tantalum target. The tantalum target prepared by the method has uniform crystallization, with a grain size between 50 μm and 120 μm. A texture component where a texture (110) dominants in the thickness direction of the target is obtained. A total proportion of three textures (111), (110) and (100) is between 40% and 50%, ensuring a consistent sputtering rate of the tantalum target during use.

11 Claims, 5 Drawing Sheets

(56) References Cited

OTHER PUBLICATIONS

Translation of CN 102517531 A (published Jun. 27, 2012) from Espacenet.*
Translation of CN 101670521 A (published Mar. 17, 2010) from Espacenet.*
Chinese First Office Action, Chinese Application No. 201210292279.6, dated Jul. 1, 2014, 9 pages (with English Summary).
PCT International Search Report, PCT/CN2013/081636, dated Nov. 28, 2013, 6 Pages.

* cited by examiner

METHOD FOR PREPARING HIGH-PERFORMANCE TANTALUM TARGET

FIELD OF THE INVENTION

The present invention relates to the technical field of nonferrous metal metallurgy, especially to a method for preparing a high-performance tantalum target material.

BACKGROUND OF THE INVENTION

Tantalum target materials are mainly applied in semiconductor film coating industry.

Physical vapor deposition (PVD), being one of the most essential processes in semiconductor chip production, is aimed at depositing a metal or a compound of a metal in a form of thin film onto a silicon wafer or other substrates, and finally forming complex wiring structure in semiconductor chip by cooperation of photolithography, etching and the like. PVD is completed via a sputtering machine station, and sputtering target materials are a very important and key consumptive material used in the process. Common sputtering target materials comprise highly pure tantalum, and also other nonferrous metals such as Ti, Al, Co, Cu or the like.

With increase of a wafer size from 200 mm (8 inches) to 300 mm (12 inches), the size of corresponding sputtering target material has to be increased so as to meet basic requirements of film coating by PVD. Meanwhile, when line width is decreased from 130-180 mm to 90-45 mm, the sputtering target material is changed from ultrahigh-purity Al/Ti system to ultrahigh-purity Cu/Ta system based on conductivity of a conductor and matching performance of a barrier layer. Ta target materials have increasing importance in the semiconductor sputtering industry, and demand therefore is bigger and bigger.

In prior art, tantalum target materials are mainly obtained by a process of cold rolling or cold forging. The texture components in the thickness direction of the target materials obtained are not uniform, which mainly embodies in texture (100) dominating in the upper and lower surfaces of the target materials but texture (111) dominating therebetween. Such target materials may be used on a machine station with low use requirements, but when they are used on a high-end machine station such as 12" machine station, the inconsistent sputtering rate occurring is unacceptable.

SUMMARY OF THE INVENTION

An object of the present invention is to overcome the above-mentioned defects in prior art and to provide a process for preparing a high-performance tantalum target material which has uniform texture components in the thickness direction and has a dominant texture in the upper and lower surfaces. In addition, the process provides an even sputtering rate and meets requirements for use in high-end sputtering.

The present invention is designed based on the following principles.

The uniformity in thickness of a thin film on a silicon wafer after sputtering is very important to the final product, and it depends on the internal structure and the texture orientation of a tantalum target. A target material in which the crystal grains are uniform and fine and have approximately the same crystalline orientation enables sputtering rate of the crystal grains to be sputtered approaching to the same and the angular distribution trajectory of the sputtered atoms approaching to the same in sputtering, such that a coated layer with a uniform thin film thickness can be obtained and the material utilization ratio of the tantalum target can be increased greatly.

Therefore, the present invention provides the following technical solution.

A method for preparing a high-performance tantalum target material is characterized in that it comprises: first preparing a tantalum ingot into a forged blank by a process of cold forging in combination with hot forging; then rolling by a hot rolling process; and finally leveling, and blanking, cutting and performing surface treatment according to size of a finished product, so as to obtain the tantalum target material.

The above process of cold forging in combination with hot forging comprises: first performing primary forging to the tantalum ingot by the cold forging process, performing secondary forging by the hot forging process after pickling and heating treatment, and then performing tertiary forging by the hot forging process after pickling and heating treatment again.

The above cold forging process may be carried out by adopting cold forging processes that are known in the art, preferably swaging, with a forging ratio controlled within 25%-40%.

The above hot forging process is completed under hot forging conditions that are known in the art. Specifically, the process comprises upsetting and stretching a target blank at a temperature ranging from 800° C. to 1200° C., wherein the upsetting ratio is controlled within 55%-80%, and during stretching, a forging feed L=0.6-0.8 h, and a reduction Δh=0.12-0.15 h, wherein h represents the height of the blank before forging.

In one embodiment of the present invention, prior to upsetting and stretching, the target blank is first preheated to 200° C. and then coated with 1-3 mm thick glass frit thereon. The glass frit used in the present invention may be selected from glass frit used for hot compression, for example, those usable within the temperature range from 800° C. to 1200° C. In a preferred embodiment, glass frit with a particle size of 100 mesh is used. Commercial glass frit may also be used, e.g., type 844-7 spraying powder produced by Beijing Tianlichuang glass technology development co., ltd.

In one embodiment of the present invention, after the above tertiary forging, pickling and heating treatment are further needed, wherein a mixed acid is used in pickling, e.g., a mixed acid liquor of HCl and HF at a volume ratio of 5:2 or a mixed acid liquor of HCl, HF, and $H_2SO_4$ at a volume ratio of 5:3:2. Other mixed acids with appropriate ratios may also be used. The heating treatment is carried out at a temperature being 25%-45% of the melting point of the tantalum material for a time ranging from 60 to 120 min, such as 70 min, 80 min, 90 min, 100 min or 110 min.

In another embodiment of the present invention, the above tantalum ingot is a cast ingot with a Ta content≥99.95%, preferably ≥99.99% and a diameter from 160 mm to 300 mm.

In still another embodiment of the present invention, the step of rolling by a hot rolling process comprises: first preheating the forged blank to 900-1200° C., e.g., 950° C., 1000° C. or 1100° C., then rolling, and pickling until the tantalum metal is lustrous without mottles.

In a preferred embodiment, the total rolling ratio is controlled within 65%-85%, and the rolling temperature is controlled at 800-1200° C. The rolling adopts cross rolling with rolling direction turned clockwise by 45° for each time, in which the rolling ratio of the previous 8 passes is controlled within 50%-75%, and the subsequent rolling is mainly for compensating tolerance.

In a preferred embodiment, reheating in furnace is performed at a temperature of 900-1200° C., e.g., 950° C., 1000° C. or 1100° C. after rolling for every 2-6 passes during the above rolling.

In a preferred embodiment, prior to the rolling, surface of the blank is uniformly coated with 1-3 mm thick glass frit.

In a preferred embodiment, the pickling is carried out in a mixed acid liquor of HCl, HF, and $H_2SO_4$ at a volume ratio of 5:3:2, and the pickling time is controlled to be 5 to 10 min.

In the present invention, tantalum ingot is forged by a process of cold forging in combination with hot forging, and the resulting forged blank is rolled by a hot rolling process so as to obtain a high-performance tantalum target material that meets requirements for use in high-end sputtering machine stations.

Particular technical features are as follows:

1. Forging by a process of cold forging in combination with hot forging can increase forging ratio, effectively trigger more slip systems, and effectively break the columnar crystal zones in the cast ingot, central equiaxial crystal zones, and fine crystal zones adjacent to edge of the tantalum ingot. Since the columnar crystal zones in the cast ingot, central equiaxial crystal zones, and fine crystal zones adjacent to edge of the tantalum ingot are effectively broken, metal flow in central part of the blank is increased, nonuniform degree of the central structure is remarkably reduced, and the original cast coarse-grain structure thereof is fully broken from multiple directions under action of forces in multiple directions. In this way, the forged plate blank obtains a structure with relatively uniform grains, and avoids presence of harmful structures such as "crystal zone" structure and coarse-grin structure subsequently remaining because the central part is not fully broken.

2. Nonuniform distribution of deformation in height of section of a rolled part is closely related with the shape coefficient in a deformed zone. If the shape coefficient $L(L=(R\Delta h)^{1/2}/h)$ (wherein R is radius of roller; $\Delta h$ is reduction; and h is average thickness) in the deformed zone is small, influence of outer end on the deformation process becomes prominent, and compressive deformation cannot go deep into inside of the tantalum blank, but limited in the region adjacent to the surface layer. At this time, the deformation in the surface layer is greater than that in the central layer, and metal flow velocity and stress distribution are not uniform. By hot rolling, the present invention can effectively enhance flowability of material and achieve rolling with a large shape coefficient in deformed zone. Rolling compressive deformation completely goes deep into inside of the tantalum blank such that the deformation in the central layer is equal to or slightly greater than the deformation in the surface layer, thereby to promote the plate blank to be rolled and deformed into a shape of "waist drum" rather than a shape of "hyperbola". Rolling by such a method can effectively break coarse columnar grains remaining from the previous procedure, because this process can cause more dislocations accumulated along coarse grain boundaries, further effect uniformity and fineness in the grains of the plate blank, and promote grains to slip on plural slip surfaces (lines), which completes former treatment for subsequent heating treatment to from γ strong texture.

For the high-performance tantalum target material prepared by the method according to the present invention, firstly, it has uniform crystallization with grain size between 50 μm and 120 μm; and secondly, texture components where texture (110) dominates in the thickness direction of the target material are obtained, and they are uniform in the thickness direction. Compared with common tantalum target material, the high-performance tantalum target material not only achieves texture components where texture (110) dominates in the thickness direction of the target material, but also sets forth higher requirements for uniformity in the textures (a total proportion of three textures (111), (110) and (100) comprises between 40% and 50%), thereby ensuring a consistent sputtering rate during use.

In another aspect, the present invention relates to a high-performance tantalum target material prepared by the above method. In one embodiment, the tantalum target material has a tantalum content≥99.99%. In another embodiment, the grain size of the tantalum target material is between 50 μm and 120 μm. In another embodiment, the texture is dominant in the thickness direction (110) of the tantalum target material, and a total proportion of three textures (111), (110) and (100) is between 40% and 50%.

In still another aspect, the present invention relates to use of the high-performance tantalum target material prepared according to the aforementioned methods in film coating of a semiconductor, in particular, in film coating by physical vapor deposition.

BRIEF DESCRIPTION OF THE DRAWINGS

The technical solutions and technical advantages of the present invention are illustrated below with reference to the drawings, in which.

DETAILED DESCRIPTION OF EMBODIMENTS

A method for preparing a high-performance tantalum target material according to a preferred embodiment of the present invention will be described below in details. The overall processing solution of the method is as follows:

tantalum ingot—primary forging—pickling—heating treatment—secondary forging—pickling—heating treatment—tertiary forging—pickling—heating treatment—rolling—pickling—heating treatment—leveling—blanking—cutting—surface treatment—checking of the finished product.

The specific solution is as follows:

1. Tantalum ingot: 160 mm≤diameter≤300 mm; chemical composition: Ta≤99.99%.

2. Primary forging: cold forging, adopting swaging process, in which tantalum ingot with a large diameter is forged with a forging ratio controlled within 25%-40%.

3. Pickling: HCl:HF=5:2 (volume ratio), the pickling time is controlled to be 2-5 min, the treatment is mainly for removing surface impurities, and it is stopped till the luster of tantalum metal can be observed visually without mottles.

4. Heating treatment: the heating treatment is carried out at a temperature being 25%-45% of the melting point of tantalum material for 60 min.

5. Secondary forging: hot forging process is used. Specifically, it is first preheated to 200° C., then coated with 1-3 mm thick glass frit; subsequently, the target blank is heated to 800° C. to 1200° C., and subjected to primary upsetting and stretching, wherein the upsetting ratio is controlled within 55%-80%, and during stretching, the forging feed L=0.6-0.8 h (h represents height of the blank before forging), and the reduction Δh=0.12-0.15 h. To achieve a relatively uniform deformation, the feed position for the current compression should be staggered with the feed position for the previous compression during stretching. Standard gauge block is used as a cushion block to ensure uniformity and controllability in each reduction.

6. Pickling: $HCl:HF:H_2SO_4$=5:3:2 (volume ratio), the pickling time is controlled within 5 to 10 min to remove surface impurities, and it is stopped till the luster of tantalum metal can be observed visually without mottles.

7. Heating treatment: the heating treatment is carried out at a temperature being 25%-45% of the melting point of tantalum material for 60 min.

8. Tertiary forging: hot forging is used. Specifically, it is first preheated to 200° C., then coated with 1-3 mm thick glass frit; subsequently, the target blank is heated to 800° C. to 1200° C., and subjected to secondary upsetting and stretching, wherein the upsetting ratio is controlled within 55%-80%. During stretching, the forging feed L=0.6-0.8 h (h represents height of the blank before forging), and the reduction Δh=0.12-0.15 h. To achieve a relatively uniform deformation, the feed position for the current compression should be staggered with the feed position for the previous compression during stretching. Standard gauge block is used as a cushion block to ensure uniformity and controllability in each reduction. In upsetting, the height is adjusted according to size of the finished product.

9. Pickling: $HCl:HF:H_2SO_4$=5:3:2 (volume ratio), the pickling time is controlled within 5 to 10 min to remove surface impurities, and it is stopped till the luster of tantalum metal can be observed visually without mottles.

10. Heat treatment: the heating treatment is carried out at a temperature being 25%-45% of the melting point of tantalum material for 60 min.

11. The forged blank is preheated to 900° C. to 1200° C.

12. Rolling, the thickness is controlled to be the thickness of the finished product required by customers plus a machining allowance of 2-4 mm.

1) To reduce oxidation of materials during rolling, the blank is coated with glass frit on surface thereof before rolling, and coating of the glass frit shall be uniform with a thickness controlled within 1-3 mm.

2) Total rolling ratio is controlled within 65%-85%.

3) Reheating in furnace is required after it is rolled for every 2-6 passes. The heating temperature is the same as the temperature for preheating the blank, i.e. 900° C. to 1200° C.

4) The temperature of the material is monitored in real time with a remote sensing thermometer during rolling. The rolling temperature should not be less than 800° C., and be controlled between 800° C. and 1200° C.

5) Cross rolling is adopted, wherein rolling direction turns clockwise by 45° for each time. The rolling ratio of the first 8 passes is controlled within 50%-75%, and the subsequent rolling is mainly for compensating tolerance. The thickness tolerance of the same plate is controlled within 0.5 mm.

13. Pickling is carried out in a mixed acid liquor of HCl, HF and $H_2SO_4$ at a volume ratio of 5:3:2, and the pickling time is controlled between 5 min and 10 min to remove surface impurities, and it is stopped till the luster of tantalum metal can be observed visually without mottles.

14. Heating treatment: the heating treatment is carried out at a temperature being 25%-45% of the melting point of tantalum material for 60 min.

15. Leveling, the leveling temperature is 600° C. to 800° C.

16. Blanking, an allowance of 5-10 mm is provided according to size of the finished product during blanking.

17. Cutting, the cutting is carried out according to size of the finished product.

18. Surface treatment: surface defects are removed by combination of mechanical finishing and artificial finishing.

19. Checking of finished product: the target material is detected in grain size, outline dimension, surface roughness, and planeness (different customers have different requirements).

Figure 1:
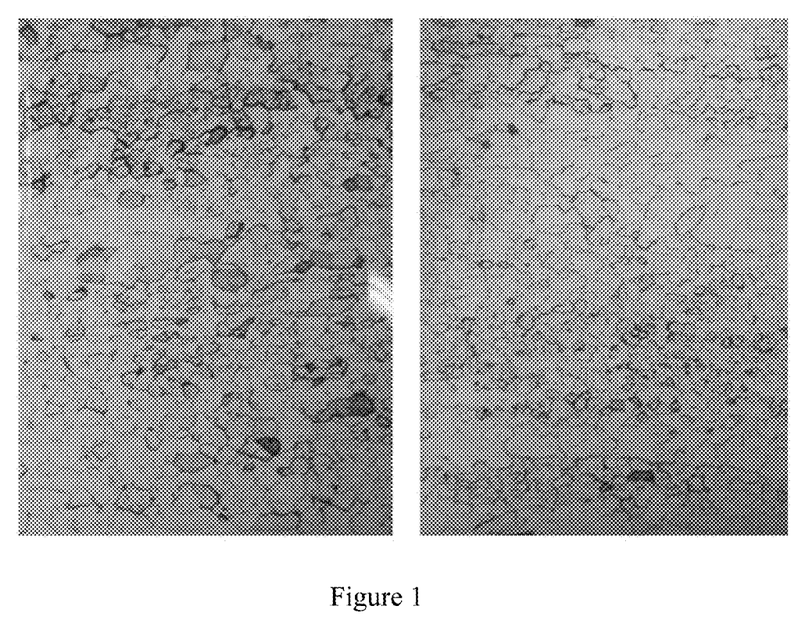
FIG. 1 shows the metallographic test result after forging according to cold forging method of the prior art.
Figure 2:
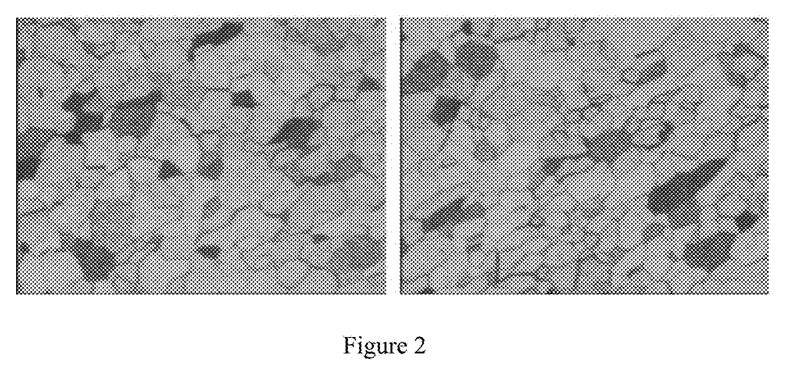
FIG. 2 shows the metallographic test result after forging according to an embodiment of the present invention.

FIG. 1 shows the metallographic test after forging of the tantalum ingot according to cold forging method of the prior art;

FIG. 2 shows the metallographic test after forging of the tantalum ingot according to one embodiment of the present invention. In the embodiment according to the present invention, a tantalum ingot is forged by a process of cold forging in combination with hot forging, and the forged blank is subjected to the metallographic test, with results shown in FIG. 2.

The results shown in FIG. 1 are compared with the results shown in FIG. 2. FIG. 1 shows after forging according to the method of the prior art, the grain size of the forged blank is nonuniform, and phenomenon of evident delamination occurs. In contrast, as shown in FIG. 2, the forged blank after forging according to the embodiment of the present invention has a uniform grain size and no evident delamination.

Figure 3:
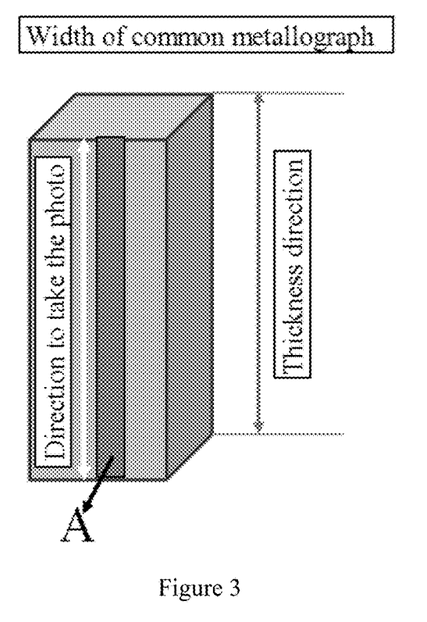
FIG. 3 shows schematic diagram of the metallographic test method for analyzing uniformity of the grain sizes in the thickness direction of the target material.

After the forged blank is rolled by hot rolling according to an embodiment of the present invention, the resultant target material is subjected to the metallographic test according to the test method shown in FIG. 3, and uniformity of grain size in the thickness direction of the target material is analyzed.

As shown in FIG. 3, the red region A is the region where metallograph is taken. Metallographs are taken continuously at a height of 1.5 mm for each time, and then the metallographs are spliced together in sequence.

Figure 4:
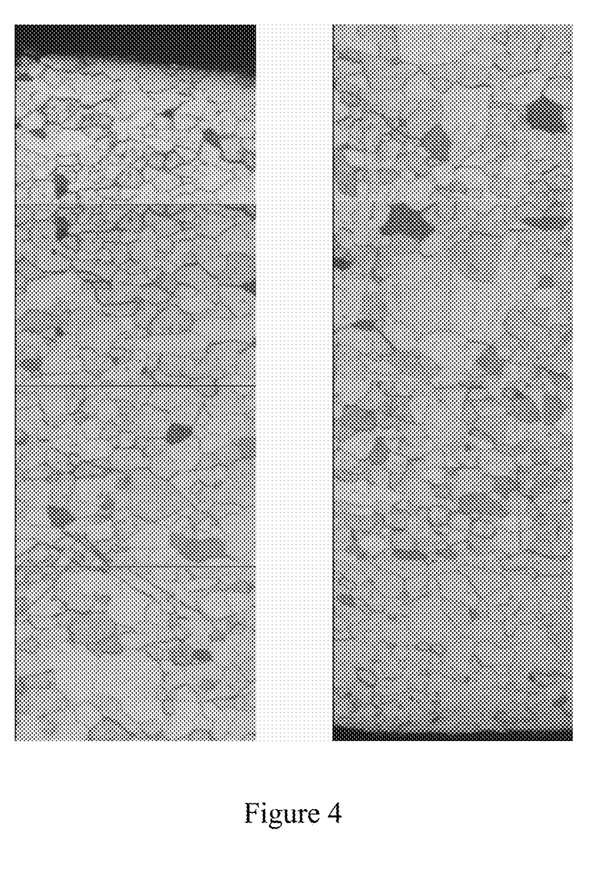
FIG. 4 shows the metallographic test result after rolling according to a method of the prior art.

FIG. 4 shows the metallographic test result of target material after the blank is rolled according to cold rolling process in the prior art.

Figure 5:
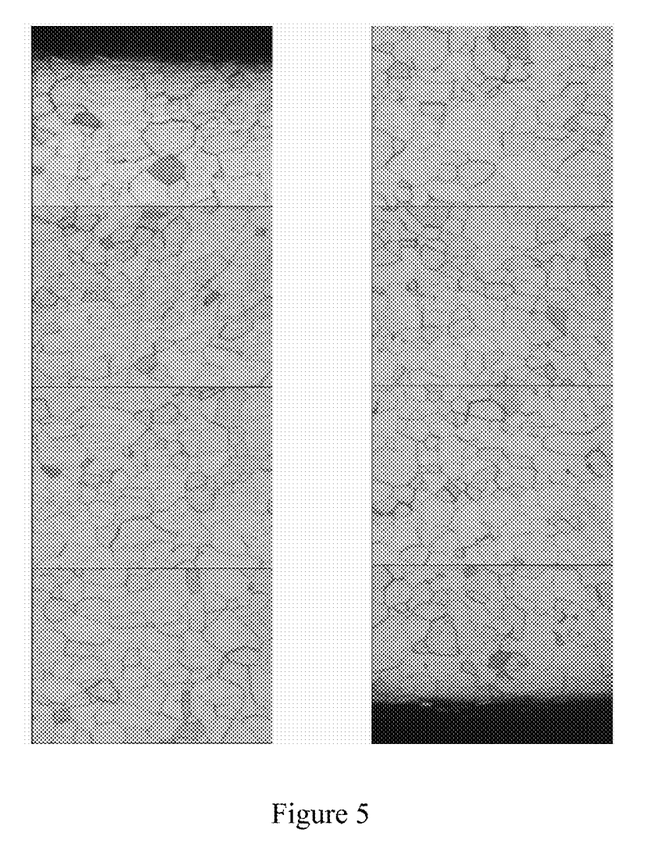
FIG. 5 shows the metallographic test result after rolling according to one embodiment of the present invention.

FIG. 5 shows the metallographic test result of target material after the forged blank is hot rolled according to hot rolling process of the present invention.

By comparison, in the target material obtained by the method in the prior art, as shown in FIG. 4, the grain size is nonuniform, phenomenon of delamination occurs, and the grain size in the central part is larger. However, in FIG. 5, the target material obtained by the method of the present invention has uniform grain size.

In addition, the target material formed after hot rolling according to the method of the present invention is subjected to texture detection. Table 1 shows detection result data of the textures of the target material rolled according to the cold rolling process in the prior art. Table 2 shows detection result data of the textures of the target material rolled according to the method of the present invention. Average grain size and proportion of each of texture components (111), (110) and (100) that are detected at points (from the top down) taken at different parts of the target material with equal intervals are listed in the tables.

TABLE 1

Detection result data of textures of the target material rolled according to the prior art

| Part | | Average grain size (μm) | Texture {100} | Texture {110} | Texture {111} |
|---|---|---|---|---|---|
| From top to bottom | 1# | 28.7 ± 21.7 | 17.8 | 11.7 | 12.3 |
| | 2# | 32.5 ± 23.9 | 18.7 | 9.94 | 22.4 |
| | 3# | 31.6 ± 24 | 11.2 | 5.6 | 39.2 |
| | 4# | 35.1 ± 29.5 | 8.82 | 6.25 | 42.6 |
| | 5# | 30.5 ± 23.5 | 17.5 | 7.74 | 19 |
| | 6# | 25.8 ± 22.3 | 15.3 | 9.7 | 19.3 |
| Whole | | 31.2 ± 25 | 14.8 | 8.43 | 26 |

TABLE 2

Detection result data of textures of the target material rolled according to the method of the present invention

| Part | | Average grain size (μm) | Texture {100} | Texture {110} | Texture {111} |
|---|---|---|---|---|---|
| From top to bottom | 1# | 29.9 ± 19.8 | 9.56 | 19.1 | 12.9 |
| | 2# | 27.5 ± 16.5 | 11.5 | 21.1 | 10.2 |
| | 3# | 29.4 ± 18.8 | 12.1 | 21.5 | 11.5 |
| | 4# | 32.9 ± 20.5 | 12 | 21.4 | 10.1 |
| | 5# | 33.4 ± 22 | 11.9 | 28.1 | 6.65 |
| | 6# | 31.2 ± 20.8 | 9.91 | 27 | 10.2 |
| | 7# | 31 ± 18.8 | 11.3 | 26 | 8.74 |
| | 8# | 33.8 ± 21 | 14.4 | 19.1 | 11.3 |
| | 9# | 38.2 ± 24.9 | 13.3 | 23 | 9.99 |
| Whole | | 31.6 ± 20.6 | 11.7 | 22.9 | 10.3 |

Figure 6:
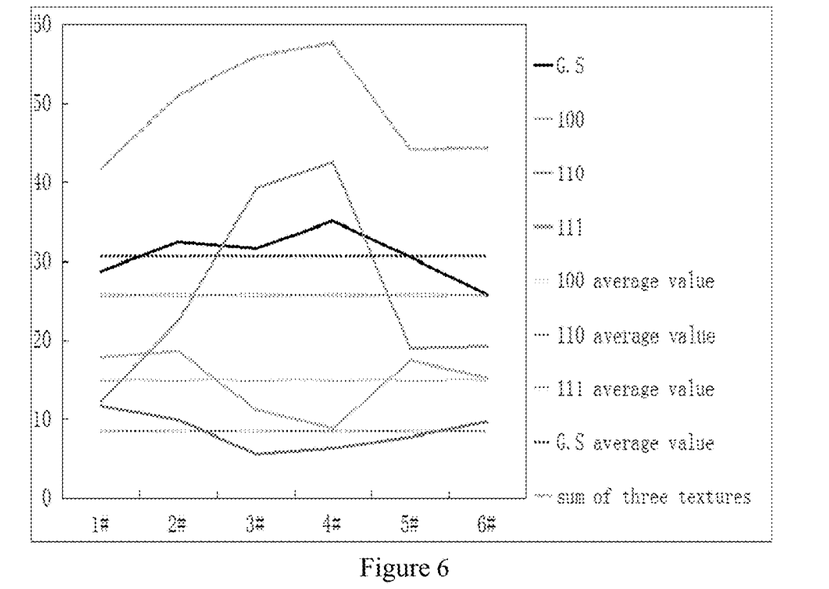
FIG. 6 shows the texture test result after rolling according to cold rolling method of the prior art.
Figure 7:
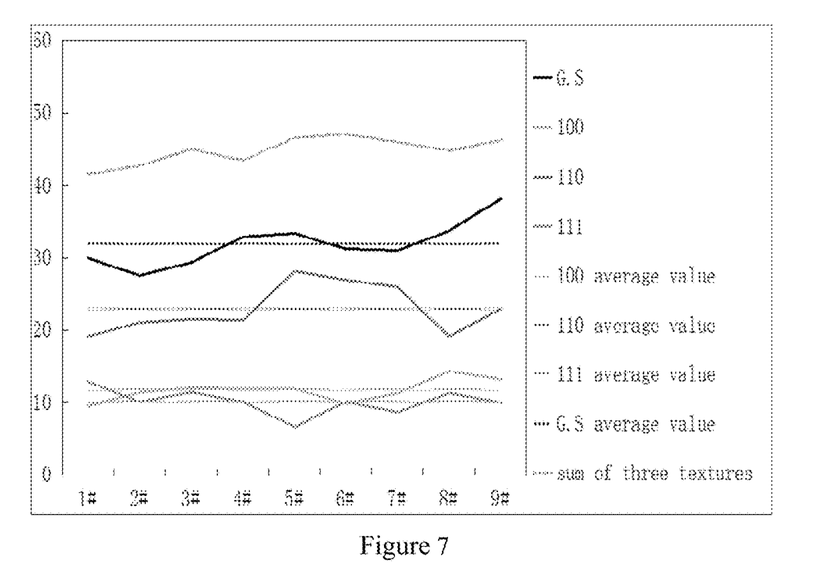
FIG. 7 shows the texture test result after rolling according to one embodiment of the present invention.

FIG. 6 shows diagram of texture result of the target material rolled according to a method in the prior art; and FIG. 7 shows diagram of texture result of the target material rolled according to an embodiment of the present invention.

As can be seen from table 1 and FIG. 6, in the target material cold rolled according to the method in the prior art, distribution of texture components is not uniform, and texture (111) is dominant and gradually increases from the surface to the central part of the target material. The total proportion of three textures (111), (110) and (100) is between 42% and 57%.

By analysis on the results shown in table 2 and FIG. 7, it can be seen that in the tantalum target material rolled according to the method of the present invention, texture components are distributed uniformly, and texture (110) is dominant. The total proportion of three textures (111), (110) and (100) is between 42% and 48%.

Consequently, by treating the high-performance rolled blank via the hot rolling process according to the present invention, a uniform high-performance tantalum target material having texture components in which texture (110) dominates in the thickness direction of the target material and meeting requirements for use in high-end sputtering machine station. Compared with common tantalum target material, the high-performance tantalum target material not only achieves texture components where texture (110) dominates in the thickness direction of the target material, but also sets forth higher requirements for uniformity in the textures (the total proportion of three textures (111) (110) and (100) comprises between 40% and 50%), thereby ensuring a consistent sputtering rate during use.

The above merely demonstrates preferred embodiments of the present invention. It should be noted that several improvements and modifications may be made by an ordinary person skilled in the art without deviation from the principle of the present invention, and such improvements and modifications shall be regarded as falling within the protection scope covered by the present invention.

The invention claimed is:

1. A method for preparing a high-performance tantalum target material, wherein it comprises: first preparing a tantalum ingot into a forged blank by a process of cold forging in combination with hot forging, wherein the hot forging comprises upsetting and stretching a target blank at a temperature of 800° C. to 1200° C., wherein an upsetting ratio is controlled within 55%-80%, and during the stretching, a forging feed L=0.6-0.8 h, and a reduction Δh=0.12-0.15 h, wherein h represents height of the target blank before the hot forging; then rolling by a hot rolling process; and finally leveling, and blanking, cutting and performing surface treatment, so as to obtain the tantalum target material.

2. The method for preparing the high-performance tantalum target material according to claim 1, wherein the process of cold forging in combination with hot forging comprises: first performing primary forging to the tantalum ingot by the cold forging, performing secondary forging by the hot forging after a first pickling and heating treatment, and then performing tertiary forging by the hot forging process after a second pickling and heating treatment.

3. The method for preparing the high-performance tantalum target material according to claim 2, wherein the cold forging process is swaging, with a forging ratio controlled within 25%-40%.

4. The method for preparing the high-performance tantalum target material according to claim 2, wherein a third pickling and heating treatment are performed after the tertiary forging, wherein a mixed acid liquor of HCl and HF at a volume ratio of 5:2 or a mixed acid liquor of HCl, HF, and H2SO4 at a volume ratio of 5:3:2 is used for the third pickling; and the third heating treatment is carried out at a temperature being 25%-45% of a melting point of tantalum material for 60-120 min.

5. The method for preparing the high-performance tantalum target material according to claim 1, wherein prior to the upsetting and stretching, the target blank is first preheated to 200° C. and then coated with 1-3 mm thick glass frit.

6. The method for preparing the high-performance tantalum target material according to claim 1, wherein the tantalum ingot is a cast ingot with Ta content≥99.99% and a diameter between 160 mm and 300 mm.

7. The method for preparing the high-performance tantalum target material according to claim 1, wherein the step of rolling by the hot rolling process comprises: first preheating the forged blank to 900-1200° C., then rolling, and pickling.

8. The method for preparing the high-performance tantalum target material according to claim 7, wherein a total rolling ratio is controlled within 65%-85%, a rolling temperature is controlled at 800-1200° C., the rolling adopts cross rolling with rolling direction turned clockwise by 45° for each time, a rolling ratio of first 8 passes is controlled within 50%-75%, and followed by subsequent rolling.

9. The method for preparing the high-performance tantalum target material according to claim 7, wherein reheating in furnace is performed at a temperature of 900-1200° C. after every 2-6 passes during the rolling.

10. The method for preparing the high-performance tantalum target material according to claim 7, wherein prior to the rolling, the forged blank is uniformly coated with 1-3 mm thick glass frit on surface thereof.

11. The method for preparing the high-performance tantalum target material according to claim 7, wherein the pickling is carried out in a mixed acid liquor of HCl, HF, H2SO4 at a volume ratio of 5:3:2, and a pickling time is controlled between 5 min and 10 min.

* * * * *